(12) United States Patent
Yuan et al.

(10) Patent No.: US 6,453,381 B1
(45) Date of Patent: Sep. 17, 2002

(54) DDR DRAM DATA COHERENCE SCHEME

(75) Inventors: Der-Min Yuan, Hsin-Chuang (TW); Gyh-Bin Wang, Chung-Li (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 09/453,045

(22) Filed: Dec. 2, 1999

(51) Int. Cl.[7] .............................. G06F 12/00; G11C 8/00
(52) U.S. Cl. ...................... 711/105; 711/167; 365/233; 365/233.5; 365/193; 365/230.04
(58) Field of Search ................... 711/105, 167; 365/233, 230.04, 233.5, 193

(56) References Cited

U.S. PATENT DOCUMENTS

| 5,402,388 A | | 3/1995 | Wojcicki et al. ............. 365/233 |
|---|---|---|---|
| 5,892,730 A | | 4/1999 | Sato et al. .................... 365/233 |
| 5,901,109 A | | 5/1999 | Miura .......................... 365/233 |
| 6,078,546 A | * | 6/2000 | Lee .............................. 365/233 |
| 6,130,853 A | * | 10/2000 | Wang et al. ............ 365/230.06 |
| 6,147,926 A | * | 11/2000 | Park ............................. 365/233 |
| 6,151,271 A | * | 11/2000 | Lee .............................. 365/233 |

* cited by examiner

Primary Examiner—Reginald G. Bragdon
(74) Attorney, Agent, or Firm—George O. Saile; Stephen B. Ackerman

(57) ABSTRACT

In this invention a double data rate (DDR) DRAM is read and written with data coherence. The data is in the form of a data burst either interleaved or sequential and of any length. The data is read from the DDR DRAM depending on whether the starting address is even or odd and taking into consideration CAS latency. Both edges of the clock are used to transfer data in and out of the DDR DRAM. To write data only the starting address of the data burst is used to maintain data coherence. Data coherence is assured by a write followed by a read of the same data to and from the same memory cell.

9 Claims, 5 Drawing Sheets

| Cond. A |
|---|
| Burst Start Address = Even<br>CAS latency = integer (2, 3, 4, etc.)<br>or<br>Burst Start Address = Odd<br>CAS latency = non-integer (1.5, 2.5, 3.5, etc.) |
| Cond. B |
| Burst Start Address = Odd<br>CAS latency = integer (2, 3, 4, etc. )<br>or<br>Burst Start Address = Even<br>CAS latency = non-integer (1.5, 2.5, 3.5, etc.) |

| Cond. C |
|---|
| Burst Start Address = Even |
| Cond. D |
| Burst Start Address = Odd |

DDR DRAM DATA COHERENCE SCHEME

BACKGROUND OF THE INVENTION

1. Field of Invention

This invention applies to semimemories and in particular to data coherence for double data rate DRAM.

2. Description of Related Art

In double data rate DRAM's (DDR DRAM's) data is read from and written into the DDR DRAM on both edges of a clock. To maintain data coherence it is necessary to insure a write to and a read from a given cell are actually performed on the same storage cell. Burst read operations in a DDR DRAM requires a starting address and a burst length after which data is presented at a out put after a NOT CAS (column address strobe) latency. To insure read coherence it is necessary to know if the NOT CAS latency is an integer or a non integer to a understand if the first piece of data is to be read with a positive edge or a negative edge of the clock. When writing data there is no NOT CAS latency and the starting address being odd or even is important to maintaining locating the memory cell for storing the data.

In U.S. Pat. No. 5,901,109 (Miura) describes synchronous dynamic random access memory (SDRAM) circuity which provides controls for read and write operations that can be carried out asynchronously al d not constrained by the clock. U.S. Pat. No. 5,892,730 (Sato et al.) describes an SDRAM which cm operate in a pipelined mode or a prefetch mode and allowing multiple data write modes to be implemented in one chip. In U.S. Pat. No. 5,402,388 (Wojcicki et al.) a method is described for adjusting the latency of a SDRAM by adjusting the timing of the CAS with respect to the system clock.

SUMMARY OF THE INVENTION

In this invention data coherence is provided for the reading and writing of a DDR DRAM in burst mode using both the positive and negative edge of the system clock. The data burst can be any length with the starting data being written to or read from either an even or odd address. Subsequent data in the burst being written to or read from an odd address if the starting address was even and an even address if the starting address was odd. To read data a CAS latency established by the BIOS at computer power up determines the number of clock cycles to read first data after the read command is set. A bit switch is used to select the BLSA. The CAS latency can be either an integer number of clock cycles or a non integer number of clock cycles requiring both the CAS latency and the starting address to be considered when reading stored data to maintain coherence.

During a read operation when the burst starting address is even and the CAS latency is an integer, or when the burst starting address is odd and the CAS latency is a non integer, data in the even BLSA and the odd BLSA are clocked directly through to an output multiplexer. The positive edge of the clock is used to clock the even address data to the output multiplexer and the negative edge of the clock is used to clock the odd address data to the output of the multiplexer. When the burst starting address is even and the CAS latency is a non integer, or when the burst starting address is odd and the CAS latency is an integer, data in the even BLSA is connected to the output multiplexer by means of circuitry clocked with the negative edge of the clock, and data in the odd BLSA s connected to the output multiplexer by means of circuitry clocked with the positive edge of the clock.

In a write operation CAS latency is not a factor and the only criteria is connecting the burst data to the proper address locations. For a write operation, burst data bits are strobed by the data strobe (DQS into registers. A positive DQS strobes data into register reg_dqs_p, and a negative DQS strobes data into registers reg_dqs_n. If the burst starting address is even, data strobed into reg_dqs_p is connected to an even BLSA (BLSA_E), and data strobed into reg_dqs_n is connected to an odd BLSA (BLSA_O). If the data burst starting address is odd, data strobed into reg_dqs_p is connected to BLSA_O and data strobed into reg_dqs_n is connected to BLSA_E.

Data coherence is assured by a write followed by a subsequent read of the same data to and from the sam, memory cell. Coherence exist when the burst starting address is even and the first bit at said output is from an even storage address. Both sequential and interleaved data bursts can be read and written with coherence using the methods in this invention.

BRIEF DESCRIPTION OF THE DRAWINGS

This invention will be described with reference to the accompanying drawings, wherein.

DETAILED DESCRIPTION OF THE PREFERRED EMBODIMENT

Figures 1A, 1B:
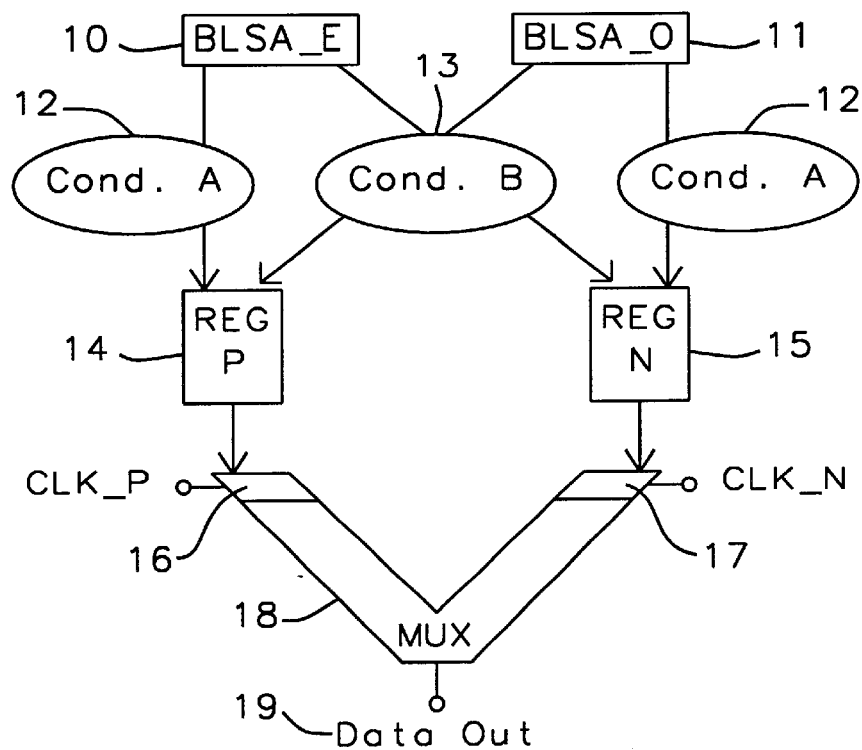
FIG. 1a is a diagram showing connections reading a double data rate DRAM.
FIG. 1b lists the conditions for connecting data from bit line sense amplifiers to a data output multiplexer.

In FIG. 1a is shown a diagram for reading a DDR DRAM. Data in an even BLSA 10 and an odd EILSA 11 are connected to registers 14 15, clocked with a positive clock edge 16 and a negative clock edge 17. The data is connected to data registers 14 15 under condition A 12 and condition B 13 as described in FIG. 1b. The data in positive edge data register 14 is clocked into a data output multiplexer 18 using a positive clock edge 16. Data in negative edge data register 15 is clocked into a data output multiplexer 18 using a negative clock edge 17. The data is clocked to the output 19 on alternate edges of the clock until the data in the length of the data burst has been transferred. The length of the data burst can be unlimited and with a starting address that is either even or odd.

Reading data from a DDR DRAM is dependent upon a CAS latency that is established at computer bring by the BIOS. FIG. 1b shows the conditions 13 12 required to read data from the DDR DRAM ,with CAS latency for integer and non integer clock cycles. When the burst start address is even an, the CAS latency is an integer, condition A 12 is used to connect data from the even address BLSA 10 and the odd BLSA 11 through registers 14,15 to the output multiplexer 18 using positive edge clock 16 for data from even addresses and negative edge clock 17 for data from odd addresses. When the burst start address is odd and the CAS latency is a non integer, condition A 12 is used to connect data from the odd address BLSA 11 and the even BLSA 10 through registers 14,15 to the output multiplexer 18 using positive edge clock 16 for data from even addresses an negative edge clock 17 for data from odd addresses.

Continuing to refer to FIGS. 1*a* and *b*, when the burst start address is odd and the CAS latency is an integer, condition B 13 is used to connect data from the even address BLSA 10 through the negative clock edge register 15 to the output multiplexer 18 using the negative clock edge 17 and to connect data from the odd address BLSA 11 through the positive clock edge register 14 to the output multiplexer 18 using the positive clock edge 16. When the burst start address is even and the CAS latency is a non integer, condition B 13 is used to connect data from the even address BLSA 10 through the negative clock edge register 15 to the output multiplexer 18 using the negative clock edge 17 and to connect data from the odd address BLSA 11 through the positive clock edge register 14 to the output multiplexer 18 using the positive clock edge 16.

Figures 2A, 2B:
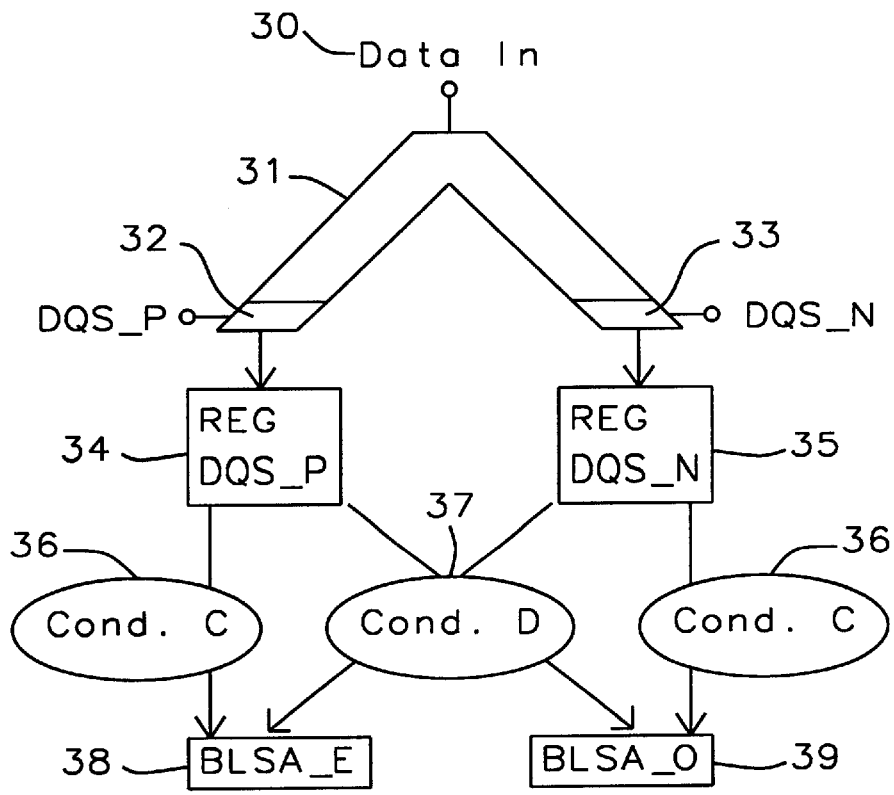
FIG. 2a is a diagram showing connections for writing a double data rate DRAM, FIG. 2b lists the conditions for connecting data in to the bit line sense amplifiers.

Referring to FIG. 2*a*, a diagram is shown for writing burst data to a DDR DRAM. There is no CAS latency involved in writing the burst data and only the starting address is required to be known to connect the input data to the appropriate BLSA 38,39. Data in 30 is strobed with a positive edge data strobe (DQS_P) 32 into register reg_dqs_p 34 and a negative edge strobe (DQS_N) 33 into register reg_dqs_n 35. As shown in FIG. 2*b*, when the burst starting address is an even address, condition C 36 applies. The even data from the positive DQS edge register 34 is connected to an e en address BLSA 38, and the odd data from the negative DQS edge register 35 is connected to an odd address BLSA 39. When the burst starting address is odd, condition D 37 applies and data in the positive DQS edge register 34 is connected to an odd address BLSA 39 with data in the negative DQS edge register 35 being connected to an even address BLSA 38.

Figure 3:
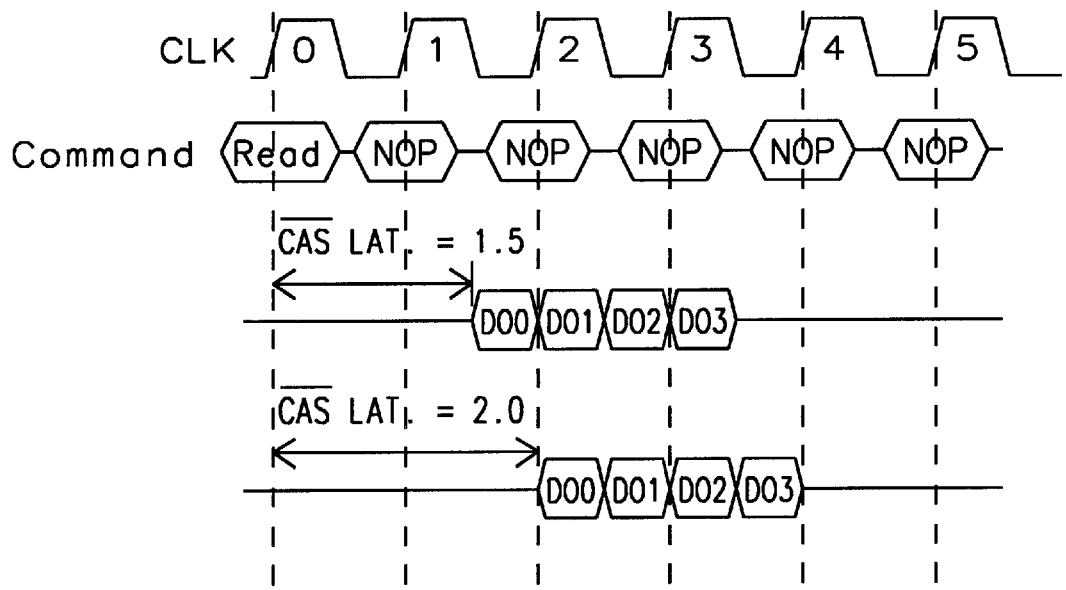
FIG. 3 shows a timing diagram for reading a double data rate DRAM.

Referring o FIG. 3, a simplified timing diagram is shown for executing a read operation for a DDR DRAM. A read command is executed on the rising edge of a clock. If the CAS latency is a non integer number of clock cycles as represented by 1.5 clock cycles in FIG. 3, the first data D00 for the burst starting address is available on the negative edge of the second clock cycle. Subsequent data from the data burst is available on each positive clock edge and negative clock edge in alternate sequence thereafter until the burst length is completed. If the CAS latency is an integer number of clock cycles as represented by 2.0 clock cycles, the first data D00 for the burst starting address is available on the positive edge of the third clock cycle. Subsequent data from the data burst is a ailable on each negative clock edge and positive clock edge in alternate sequence thereafter until the burst length is completed. Larger integer and non integer CAS latencies can be required than shown in the example of FIG. 3.

Figure 4:
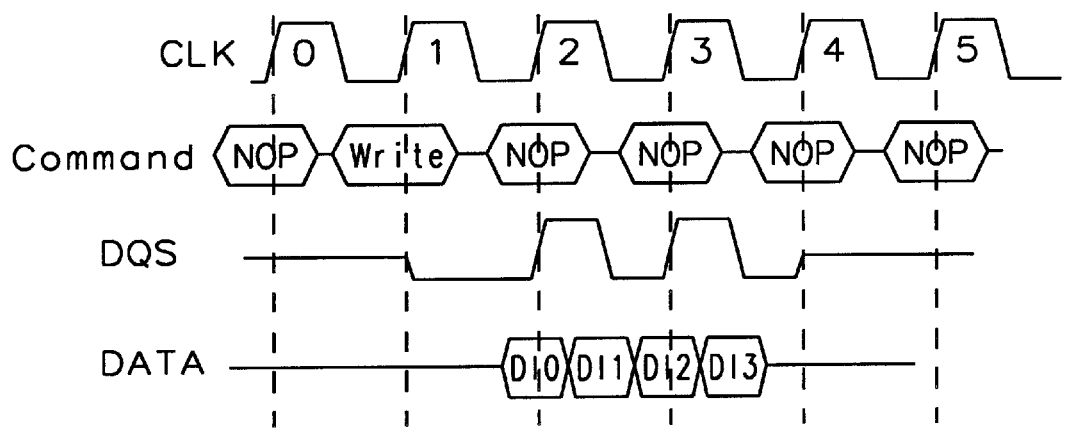
FIG. 4 shows a timing diagram for writing a double data rate DRAM.

Referring to FIG. 4, a timing diagram for writing burst data to a DDR DRAM is shown. The write command is executed on the rising edge of a clock cycle one. The first data DI 0 of the data burst is written into the starting address on the raising edge of DQS. The next data DI 2 in the data burst is written on the negative edge of DQS. The burst data continues to be written into the DDR DRAM in alternate positive and negative edges of the DQS in sequence thereafter until the burst length is complete.

Figure 5:
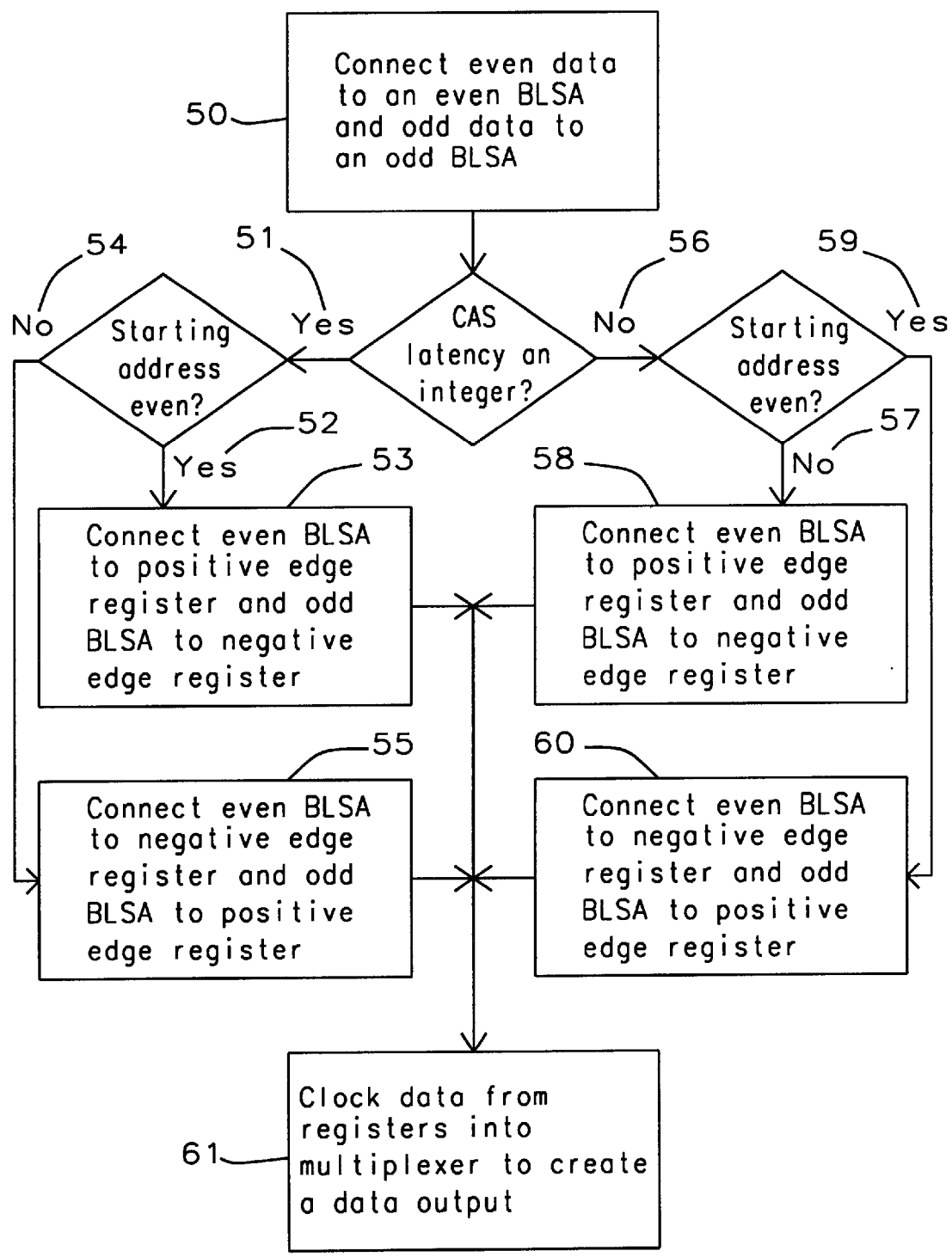
FIG. 5 is a U flow diagram of a method for reading data from a DDR RAM and maintaining data coherence.

In FIG. 5 is shown a coherence method for reading data from a DDR DRAM. Data with even addresses are connected to even BLSA's and data with odd addresses are connected to odd BLSA's 50. If the CAS latency is an integer number of clock cycles 51 and the burst starting address is even 52 then the even BLSA is connected to the register clocked with a positive clock edge, and the odd BLSA is connected to the register clocked with a negative clock edge 53. If the CAS latency is an integer number of clock cycles 51 and the burst starting address is odd 54, then the even BLSA is connected to the register clocked with a negative clock edge, and the odd BLSA is connected to the register clocked with a positive clock edge 55. If the CAS latency is not an integer number of clock cycles 56 and the burst starting address is odd 57, then the even BLSA is connected to the register clocked with a positive clock edge, and the odd BLSA is connected to the register clocked with a negative clock edge 58. If the CAS latency is not an integer number of clock cycles 56 and the burst starting address is even 59, then the even BLSA is connected to the register clocked with a negative clock edge, and the odd BLSA is connected to the register clocked with a positive clock edge 60. Clock data from registers into a multiplexer to create an output of the burst data 61 which is coherent with the writing of the burst data.

Figure 6:
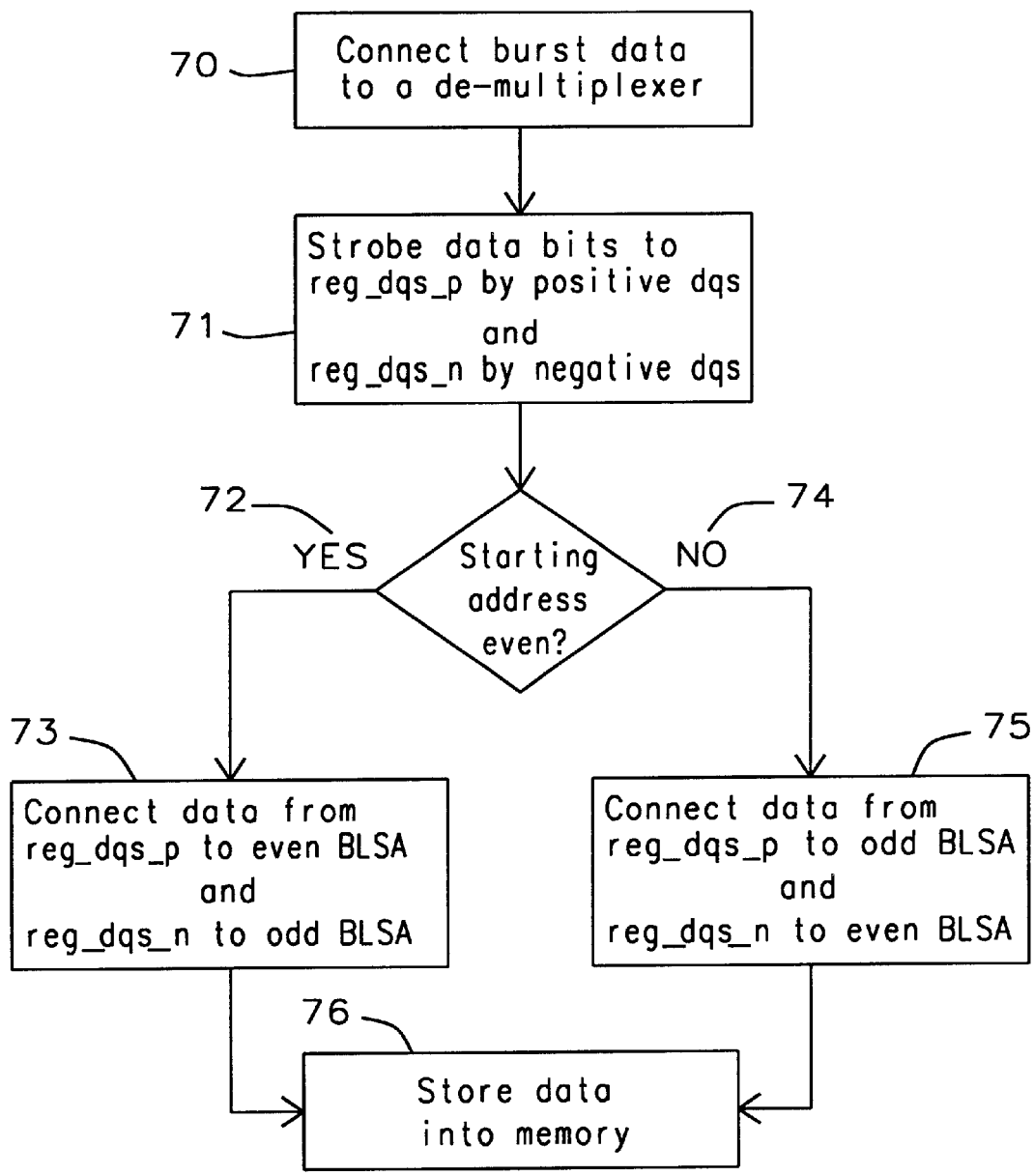
FIG. 6 is a flow diagram of a method for writing data to a DDR DRAM and maintaining data coherence.

In FIG. 6 is shown a coherence method for writing data to a DDR DRAM. Burst data is connected to a de-multiplexer 70. Data bits are strobed with a positive DQS edge strobe and a negative DQS edge strobe 71. If the starting burst address is even 72, data from the register strobed with a positive DQS edge is connected to even BLSA's and data from the register strobed with a negative DQS edge is connected to odd BLSA's 73. If the starting burst address is odd 74, data from the register strobed with a positive DQS edge is connected to odd BLSA's and data from the register strobed with a negative DQS edge is connected to even BLSA's 75. Burst data is stored into the DD DRAM with data coherence 76.

While the invention has been particularly shown and described with reference to preferred embodiments thereof, it will be understood by those skilled in the art that various changes in form and details may be made without departing from the spirit and scope of the invention.

What is claimed is:

1. A data read circuit to allow data coherence for a double data rate DRAM, comprising:

a) stored data read in a burst of data using both edges of a clock to read said data twice each clock cycle, b) CAS (column address strobe) latency determined by BIOS (basic input output subsystem) at power up, c) said stored data read on a RAS (row address strobe) cycle into even and odd bit line sense amplifiers, d) data read from said bit line sense amplifiers organized into positive clock edge data and negative clock edge data, e) said CAS latency and a starting address of stored data in said burst of data determines which edge of said clock is used to read first data of said stored data, f) said stored data clocked to an output of a multiplexer with a positive clock edge when said starting address is even and said CAS latency is an integer, g) said stored data clocked to the output of the multiplexer with a negative clock edge when said starting address is odd and said CAS latency is a non-integer, h) said stored data clocked to the output of the multiplexer with the negative clock edge when said starting address is even and said CAS latency is said non-integer, i) said stored data clocked to the output of the multiplexer with the positive clock edge when said starting address is odd and said CAS latency is said integer.

2. The data read circuit of claim 1, wherein data coherence exists when said CAS latency is an integer, said starting address is even, and data from said even bit line sense amplifiers forms said positive clock edge data, or said starting address is odd and data from said odd bit line sense amplifiers forms said positive clock edge data; and data coherence exists when said CAS latency is not an integer, wherein said starting address is odd, and data from said from said odd bit line sense amplifiers forms said negative clock edge data, or said starting address is even and data from said even bit line sense amplifiers forms said negative clock edge data.

3. The data read circuit of claim 2, wherein said data coherence applies to sequential or interleaved type of data burst and with any burst length.

4. A data read circuit to allow data coherence for a double data rate DRAM, comprising:
   a) stored data read with both edges of a clock,
   b) a CAS (column address strobe) latency determined by BIOS (basic input output subsystem) at power up,
   c) said stored data read on a RAS (row address strobe) cycle into even and odd bit line sense amplifiers,
   d) data read by said bit line sense amplifiers and organized into positive clock edge data and negative clock edge data,
   e) said CAS latency and a burst starting address of said stored data determines which edge of said clock is used to read first data of said stored data,
   f) said positive clock edge data clocked to an output of a multiplexer with a positive clock edge,
   g) said negative clock edge data clocked to the output of the multiplexer with a negative clock edge,
   h) data from even addresses organized into positive clock edge data and data from odd addresses organized into negative clock edge data when said burst starting address is even and said CAS latency is an integer number of clock cycles, or when said burst starting address is odd and said CAS latency is not an integer number of clock cycles.

5. A data read circuit to allow data coherence for a double data rate DRAM, comprising:
   a) stored data read with both edges of a clock,
   b) a CAS (column address strobe) latency determined by BIOS (basic input output subsystem) at power up,
   c) said stored data read on a RAS (row address strobe) cycle into even and odd bit line sense amplifiers,
   d) data read by said bit line sense amplifiers and organized into positive clock edge data and negative clock edge data,
   e) said CAS latency and a burst starting address of said stored data determines which edge of said clock is used to read first data of said stored data,
   f) said positive clock edge data clocked to an output of a multiplexer with a positive clock edge,
   g) said negative clock edge data clocked to the output of the multiplexer with a negative clock edge,
   h) data from even addresses organized into negative clock edge data and data from odd addresses organized into positive clock edge data when said burst starting address is odd and said CAS latency is an integer number of clock cycles, or when said burst starting address is even and said CAS latency is not an integer number of clock cycles.

6. A method for reading a double data rate DRAM, comprising:
   a) connecting data stored in memory to an even bit line sense amplifier for even storage addresses and to an odd bit line sense amplifier for odd storage addresses,
   b) connecting data from said even bit line sense amplifier to a positive edge data register and data from said odd bit line sense amplifier to a negative edge date register when a burst starting address is even and a column address strobe (CAS) latency is an integer, or when said burst starting address is odd and said CAS latency is a non integer,
   c) connecting data from said even bit line sense amplifier to said negative edge data register and data from said odd bit line sense amplifier to said positive edge data register when said burst starting address is odd and said CAS latency is an integer, or when said burst starting address is even and said CAS latency is a non integer,
   d) clocking data from said positive edge data register into a multiplexer with a positive clock edge and data from said negative edge data register into said multiplexer with a negative clock edge,
   e) creating a data output at an output of said multiplexer.

7. The method of claim 6, wherein connecting data from said even and odd bit line sense amplifiers is done relative to said burst starting address and said CAS latency to maintain data coherence.

8. The method of claim 6, wherein said method applies to sequential or interleave type data burst of any burst length.

9. The method of claim 6, wherein said CAS latency is set by BIOS at power up where said latency determines the number of clock cycles to read first data after a read command is set.

* * * * *